United States Patent
Du et al.

(10) Patent No.: US 12,413,191 B2
(45) Date of Patent: Sep. 9, 2025

(54) Ka-BAND GALLIUM-NITRIDE (GaN) MONOLITHIC-MICROWAVE INTEGRATED CIRCUIT (MMIC) POWER AMPLIFIER CIRCUIT AND AMPLIFIER

(71) Applicant: North-China Integrated Circuit Co., Ltd., Hebei (CN)

(72) Inventors: Pengbo Du, Hebei (CN); Yu Wang, Hebei (CN); Zhaotan Cui, Hebei (CN); Xuelong Jiao, Hebei (CN); Zhipeng Ren, Hebei (CN); Hanbin Qu, Hebei (CN)

(73) Assignee: North-China Integrated Circuit Co., Ltd., Hebei (CN)

( * ) Notice: Subject to any disclaimer, the term of this patent is extended or adjusted under 35 U.S.C. 154(b) by 0 days.

(21) Appl. No.: 17/921,750

(22) PCT Filed: Jun. 14, 2022

(86) PCT No.: PCT/CN2022/098522
§ 371 (c)(1),
(2) Date: Oct. 27, 2022

(87) PCT Pub. No.: WO2023/065690
PCT Pub. Date: Apr. 27, 2023

(65) Prior Publication Data
US 2024/0267009 A1 Aug. 8, 2024

(30) Foreign Application Priority Data
Oct. 20, 2021 (CN) .......................... 202111222582.4

(51) Int. Cl.
*H03F 3/191* (2006.01)
*H03F 1/56* (2006.01)
*H03F 3/24* (2006.01)

(52) U.S. Cl.
CPC ............... *H03F 3/245* (2013.01); *H03F 1/56* (2013.01); *H03F 2200/222* (2013.01); *H03F 2200/451* (2013.01)

(58) Field of Classification Search
CPC ....................................... H03F 3/191
USPC ................................. 330/302, 305
See application file for complete search history.

*Primary Examiner* — Henry Choe
(74) *Attorney, Agent, or Firm* — Kirk A. Wilson; Joseph T. Guy; Patent Filing Specialist Inc.

(57) ABSTRACT

The present disclosure provides a Ka-band gallium-nitride (GaN) monolithic-microwave integrated circuit (MMIC) power amplifier circuit and an amplifier, and belongs to the field of MMIC amplifiers. The circuit includes: a plurality of cascade-connected amplification modules. A first amplification module includes a first amplification unit, and each of the other amplification modules includes a matching network unit and an amplification unit. A microstrip line ML1 in matching network unit includes one terminal connected to an output terminal of a front-stage amplification unit and the other terminal connected to one terminal of a microstrip line ML2 and one terminal of a capacitor C1. The other terminal of the microstrip line ML2 is connected to an input terminal of a current amplification unit. The other terminal of the capacitor C1 is grounded.

19 Claims, 5 Drawing Sheets

Ka-BAND GALLIUM-NITRIDE (GaN) MONOLITHIC-MICROWAVE INTEGRATED CIRCUIT (MMIC) POWER AMPLIFIER CIRCUIT AND AMPLIFIER

CROSS REFERENCE TO RELATED APPLICATION

This application claims priority to the Chinese Patent Application No. 202111222582.4, filed with China National Intellectual Property Administration (CNIPA) on Oct. 20, 2021, and entitled "Ka-BAND GALLIUM-NITRIDE (GaN) MONOLITHIC-MICROWAVE INTEGRATED CIRCUIT (MMIC) POWER AMPLIFIER CIRCUIT AND AMPLIFIER", which is incorporated herein by reference in its entirety.

TECHNICAL FIELD

The present disclosure belongs to the field of monolithic-microwave integrated circuit (MMIC) amplifiers, and in particular, to a Ka-band gallium-nitride (GaN) MMIC power amplifier circuit and an amplifier.

BACKGROUND

Due to the increasing demand for satellite communications around the world, the frequencies used in satellite communications have gradually expanded from the C-band to the Ku-band and to the Ka-band, which requires more transceiver communication links to be added to the satellite communication system to cover different bands. The power amplifier is an important part of the satellite communication system. High power density, high output power, wide operating bandwidth, low development cost, and miniaturization of communication equipment have become the research trend of the power amplifier. Due to higher output power, wider operating bandwidth, higher working efficiency, and stronger radiation resistance, MMIC power amplifiers made of GaN materials have very broad application prospects in the field of satellite communications.

The inductor as a radio-frequency (RF) device is bulky, and in order to avoid signal crosstalk in the chip matching circuit, it is usually necessary to place the inductor at intervals from other circuits, which leads to the disadvantage that the chip with the inductor has a large size. Therefore, how to meet the dense miniaturization requirements of Ka-band GaN MMIC power amplifiers has become a difficult problem.

SUMMARY

In order to solve this technical problem, the present disclosure provides a Ka-band GaN MMIC power amplifier circuit and an amplifier to solve the problem of dense miniaturization requirements of the Ka-band GaN MMIC power amplifier.

In one aspect, the present disclosure provides a Ka-band GaN MMIC power amplifier circuit, including: a plurality of cascade-connected amplification modules. A first amplification module includes a first amplification unit, and each of all of the amplification modules except the first amplification module includes a matching network unit and an amplification unit.

An input terminal of the first amplification unit, as an input terminal of the first amplification module, is configured to input a RF signal. A current matching network unit includes an input terminal connected to an output terminal of a front-stage amplification unit and an output terminal connected to an input terminal of a current amplification unit. An output terminal of the current amplification unit is connected to an input terminal of a matching network unit of a rear-stage amplification module. An output terminal of a last amplification unit in a last amplification module, as an output terminal of the last amplification module, is configured to output the RF signal.

The matching network unit includes: a microstrip line ML1, a microstrip line ML2, and a capacitor C1. The microstrip line ML1 includes one terminal connected to the output terminal of the front-stage amplification unit and the other terminal connected to one terminal of the microstrip line ML2 and one terminal of the capacitor C1. The other terminal of the microstrip line ML2 is connected to the input terminal of the current amplification unit. The other terminal of the capacitor C1 is grounded.

Optionally, the last amplification module further includes a reactance type matching unit.

The reactance type matching unit includes an input terminal connected to the output terminal of the last amplification unit in the last amplification module and a first output terminal serving as the output terminal of the last amplification module.

Optionally, the first amplification module further includes an input network unit.

The input network unit includes a first input terminal serving as the input terminal of the first amplification module and an output terminal connected to the input terminal of the first amplification unit.

Optionally, each of the amplification modules further includes a gate bias unit and a drain bias unit.

The gate bias unit includes an input terminal configured to connect a first power supply and an output terminal connected to the input terminal of the current amplification unit and the output terminal of the current matching network unit or the input network unit The drain bias unit includes an input terminal configured to connect a second power supply and an output terminal connected to the output terminal of the current amplification unit or a second output terminal of the reactance type matching unit of the last amplification module.

The first power supply is different from the second power supply.

Optionally, the amplification unit of each of the amplification modules includes: a transistor.

The transistor includes a gate serving as the input terminal of the current amplification unit, a drain serving as the output terminal of the current amplification unit, and a source grounded.

Optionally, the last amplification module includes at least four transistors, and the reactance type matching unit includes: a capacitor C3, a capacitor C4, a capacitor C5, a capacitor C6, a microstrip line ML5, a microstrip line ML6, a microstrip line ML7, a microstrip line ML8, a microstrip line ML9, a microstrip line ML10, a microstrip line ML11, a microstrip line ML12, and a microstrip line ML13.

The capacitor C3 includes one terminal connected to a drain of a first transistor in the last amplification module and one terminal of the microstrip line ML5, and the other terminal grounded.

The capacitor C4 includes one terminal connected to a drain of a second transistor in the last amplification module and one terminal of the microstrip line ML6, and the other terminal grounded.

The capacitor C5 includes one terminal connected to a drain of a third transistor in the last amplification module and one terminal of the microstrip line ML7, and the other terminal grounded.

The capacitor C6 includes one terminal connected to a drain of a fourth transistor in the last amplification module and one terminal of the microstrip line ML8, and the other terminal grounded.

The other terminal of the microstrip line ML5 is connected to the other terminal of the microstrip line ML6 and then connected to one terminal of the microstrip line ML9. The other terminal of the microstrip line ML7 is connected to the other terminal of the microstrip line ML8 and then connected to one terminal of the microstrip line ML10. The other terminal of the microstrip line ML9 is connected to one terminal of the microstrip line ML11. The other terminal of the microstrip line ML11 is connected to one terminal of the microstrip line ML12 and one terminal of the microstrip line ML13. The other terminal of the microstrip line ML12 is connected to the other terminal of the microstrip line ML10. The other terminal of the microstrip line ML13 serves as the output terminal of the reactance type matching unit.

Optionally, when there are three cascade-connected amplification modules, an amplification unit in a second amplification module and an amplification unit in a third amplification module have a gate width ratio of 2.5.

In another aspect, the present disclosure further provides an amplifier, including any of the above Ka-band GaN MMIC power amplifier circuits.

Compared with the prior art, the present disclosure has the following beneficial effects:

The present disclosure forms a power amplifier circuit by adopting a plurality of cascade-connected amplification modules. The simple and compact matching network unit is adopted, and the microstrip line is adopted to replace an inductor. The whole chip does not contain an inductance element. A problem of a large area of a chip with an inductance device is solved. The area of the chip is greatly reduced while ensuring that other performance indexes are met, and power density is further improved, which meets dense miniaturization requirements of the Ka-band GaN MMIC power amplifier.

BRIEF DESCRIPTION OF THE DRAWINGS

To describe the technical solutions of the present disclosure more clearly, the following briefly describes the accompanying drawings required for describing the embodiments or the prior art. Apparently, the accompanying drawings in the following description merely show some embodiments of the present disclosure, and those of ordinary skill in the art may still derive other accompanying drawings from these accompanying drawings without creative efforts.

DETAILED DESCRIPTION OF THE EMBODIMENTS

In the following description, specific details such as a specific system structure and a technology are provided for description instead of limitation, to thoroughly understand embodiments of the present disclosure. However, those skilled in the art should understand that the present disclosure may also be implemented in other embodiments without these specific details. In other cases, detailed descriptions of a well-known system, apparatus, circuit, and method are omitted to avoid unnecessary details interfering with the description of the present disclosure.

To describe the technical solutions described in the present disclosure, specific embodiments are used for description below.

Embodiment 1

Figure 1:
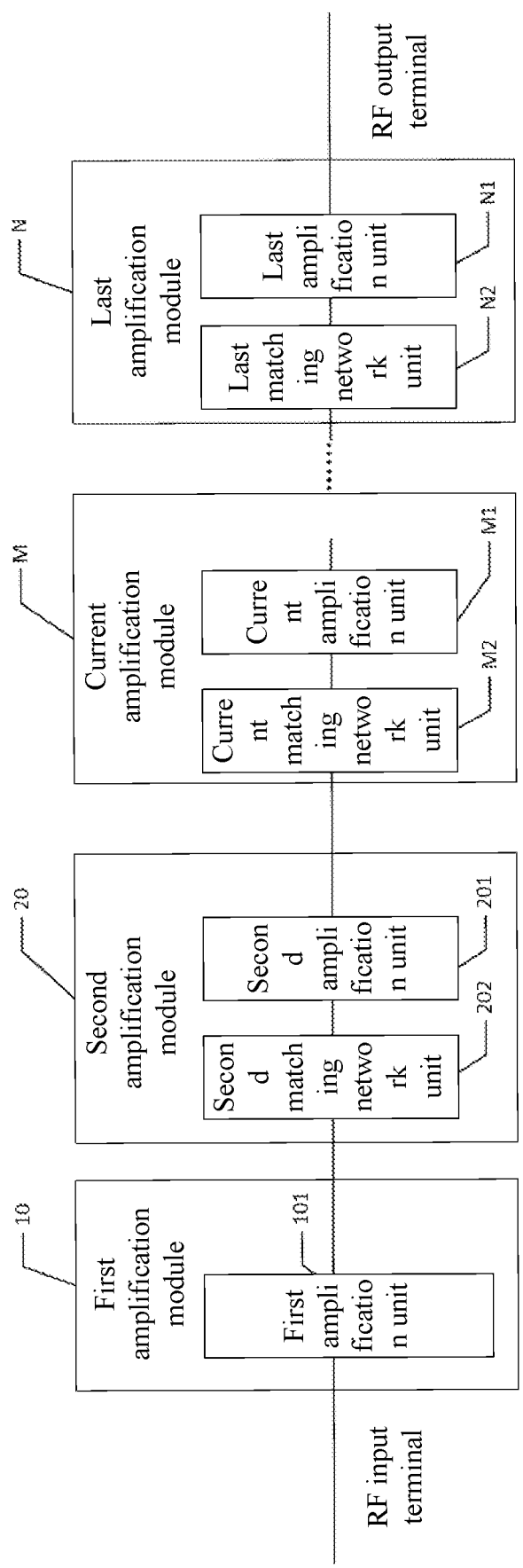
FIG. 1 is a schematic structural diagram of a Ka-band GaN MMIC power amplifier circuit provided by Embodiment 1 of the present disclosure.

As shown in FIG. 1, the present embodiment provides a Ka-band GaN MMIC power amplifier circuit, including: a plurality of cascade-connected amplification modules. A first amplification module 10 includes a first amplification unit 101, and each of all of the amplification modules except the first amplification module 10 includes a matching network unit and an amplification unit. As shown in FIG. 1, the power amplifier circuit may further include a second amplification module 20, a current amplification module M, . . . , and a last amplification module N, where N is greater than or equal to 3, and M is less than N. The second amplification module 20 includes a second matching network unit 202 and a second amplification unit 201. The current amplification module M includes a current matching network unit M2 and a current amplification unit M1.

An input terminal of the first amplification unit 101, as an input terminal of the first amplification module 10, is configured to input a RF signal. An input terminal of the current matching network unit M2 is connected to an output terminal of a front-stage amplification unit. As shown in FIG. 1, when the front-stage amplification unit is the second amplification unit 201, the input terminal of the current matching network unit M2 is connected to an output terminal of the second amplification unit 201. An output terminal of the current matching network unit M2 is connected to an input terminal of the current amplification unit M1. An output terminal of the current amplification unit M1 is connected to an input terminal of a matching network unit of a rear-stage amplification module. An output terminal of an amplification unit N1 in a last amplification module N, as an output terminal of the last amplification module N, is configured to output the RF signal.

Figure 2:
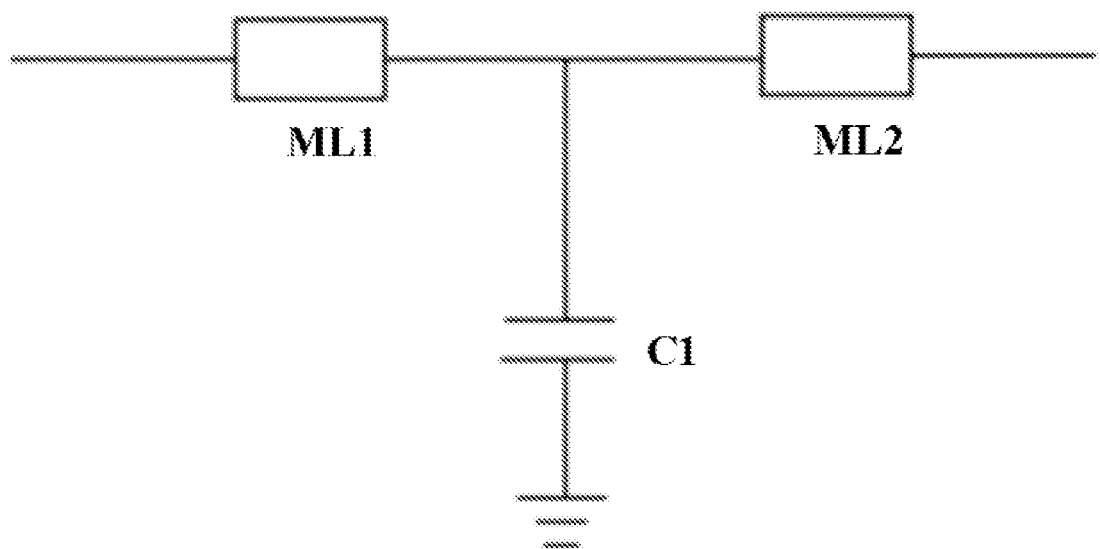
FIG. 2 is a schematic structural diagram of a matching network unit provided by Embodiment 1 of the present disclosure.

As shown in FIG. 2, the matching network unit includes: a microstrip line ML1, a microstrip line ML2, and a capacitor C1. The microstrip line ML1 includes one terminal connected to the output terminal of the front-stage amplification unit and the other terminal connected to one terminal of the microstrip line ML2 and one terminal of the capacitor C1. The other terminal of the microstrip line ML2 is connected to the input terminal of the current amplification unit M1. The other terminal of the capacitor C1 is grounded.

The matching network unit adopts a simple and compact T-shaped structure, and the microstrip line is adopted to replace an inductor. Since the high-impedance microstrip line exhibits inductance characteristics, the microstrip line can be used to replace the inductor in the matching network, such that the whole matching network unit does not contain an inductance element. A problem of a large area of a chip with an inductance device is solved. The area of the chip is greatly reduced while ensuring that other performance indexes are met, and power density is further improved. In addition, the capacitor C1 may be a metal-insulator-metal (MIM) capacitor. The MIM capacitor is adopted to replace an ideal capacitor.

Figure 3:
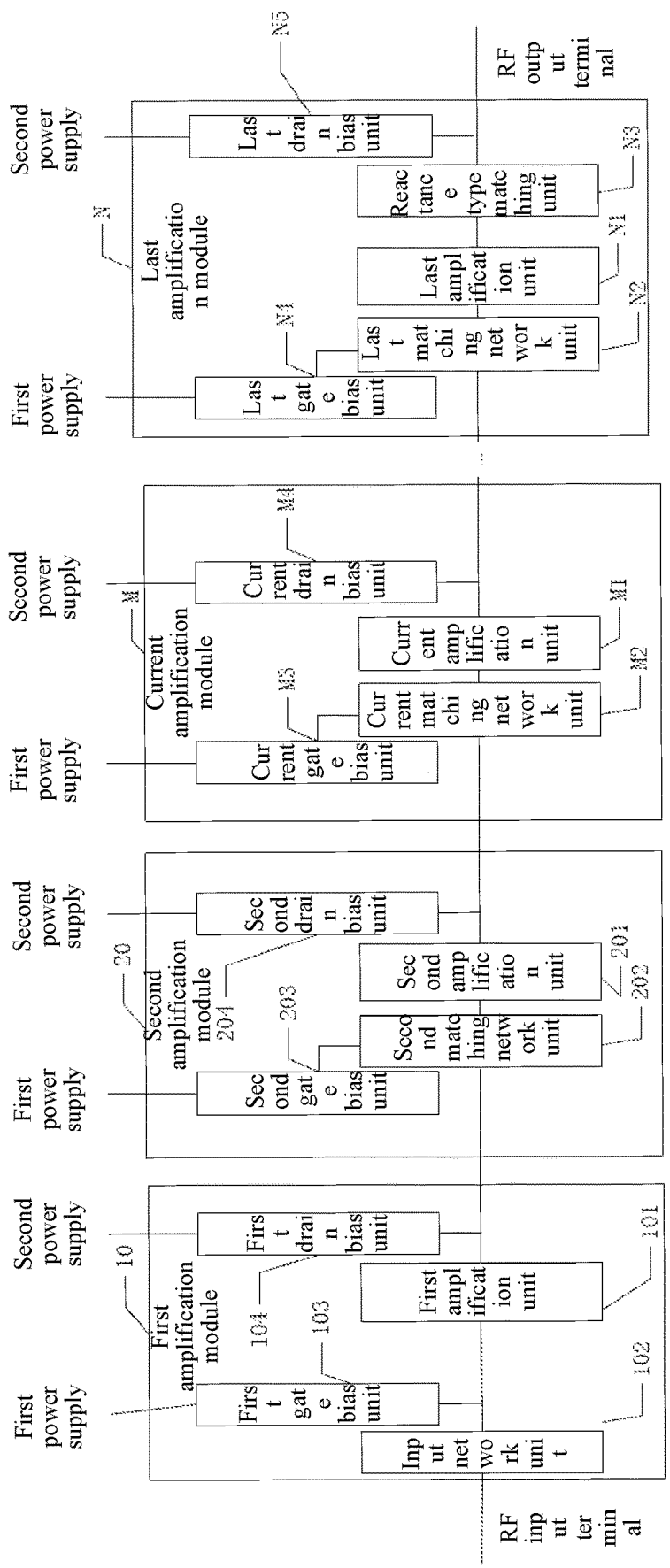
FIG. 3 is a schematic structural diagram of another Ka-band GaN MMIC power amplifier circuit provided by Embodiment 1 of the present disclosure.

Optionally, as shown in FIG. 3, the last amplification module N further includes a reactance type matching unit N3.

The reactance type matching unit N3 includes an input terminal connected to the output terminal of the amplification unit (that is, the last amplification unit N1) in the last amplification module N and a first output terminal serving as the output terminal of the last amplification module N. The reactance type matching unit N3 is configured for power synthesis of the last amplification unit N1, such that the final output power of one channel is output through the RF output terminal.

Optionally, as shown in FIG. 3, the first amplification module 10 further includes an input network unit 102.

The input network unit 102 includes a first input terminal serving as the input terminal of the first amplification module 10 to input the RF signal and an output terminal connected to the input terminal of the first amplification unit 101. The input network unit 102 can play an impedance matching role. When there are two amplification units in the first amplification module 10, that is, when there are two transistors, power coordination is performed between the two input network units 102, so as to play the role of power distribution and matching.

Optionally, each of the amplification modules may further include a gate bias unit and a drain bias unit. As shown in FIG. 3, the first amplification module 10 includes a first gate bias unit 103 and a first drain bias unit 104. The second amplification module 20 includes a second gate bias unit 203 and a second drain bias unit 204. The current amplification module M includes a current gate bias unit M3 and a current drain bias unit M4. The last amplification module N includes a last gate bias unit N4 and a last drain bias unit N5.

As shown in FIG. 3, each of the gate bias unit includes an input terminal configured to connect a first power supply and an output terminal connected to the input terminal of the current amplification unit M1 and the output terminal of the current matching network unit M2 or the input network unit 102. The first amplification module 10 includes the input network unit 102, so the output terminal of the first gate bias unit 103 included in the first amplification module 10 is connected to the output terminal of the input network unit 102 and the input end of the first amplification unit 101. Each of the other amplification modules except the first amplification module 10 does not include the input network unit 102, but include the matching network unit. Therefore, the output terminal of the gate bias unit in each of the other amplification modules is connected to the output terminal of the matching network unit and the input terminal of the current amplification unit M1.

The drain bias unit includes an input terminal configured to connect a second power supply and an output terminal connected to the output terminal of the current amplification unit M1 or a second output terminal of the reactance type matching unit N3 of the last amplification module N.

It should be noted that the first power supply is different from the second power supply. The first power supply is a power supply that provides a negative voltage, which can be represented by Vg, and the second power supply is a power supply that provides a positive voltage, which can be represented by Vd. For example, the first power supply may be a −20 V power supply, and the second power supply may be a 20 V power supply.

As shown in FIG. 3, an output terminal of the first drain bias unit 104 of the first amplification module 10 is connected to the output terminal of the first amplification unit 101 to supply power to a drain of an active device in the first amplification unit 101 by the first drain bias unit 104. Similarly, an output terminal of the second drain bias unit 204 of the second amplification module 20 is connected to the output terminal of the second amplification unit 201 to supply power to a drain of an active device in the second amplification unit 201 by the second drain bias unit 204. Since the last amplification module N includes the reactance type matching unit N3, an output terminal of the last drain bias unit N5 in the last amplification module N is connected to the second output terminal of the reactance type matching unit N3.

The following embodiment will describe the circuit connection corresponding to each module in detail.

Figure 4:
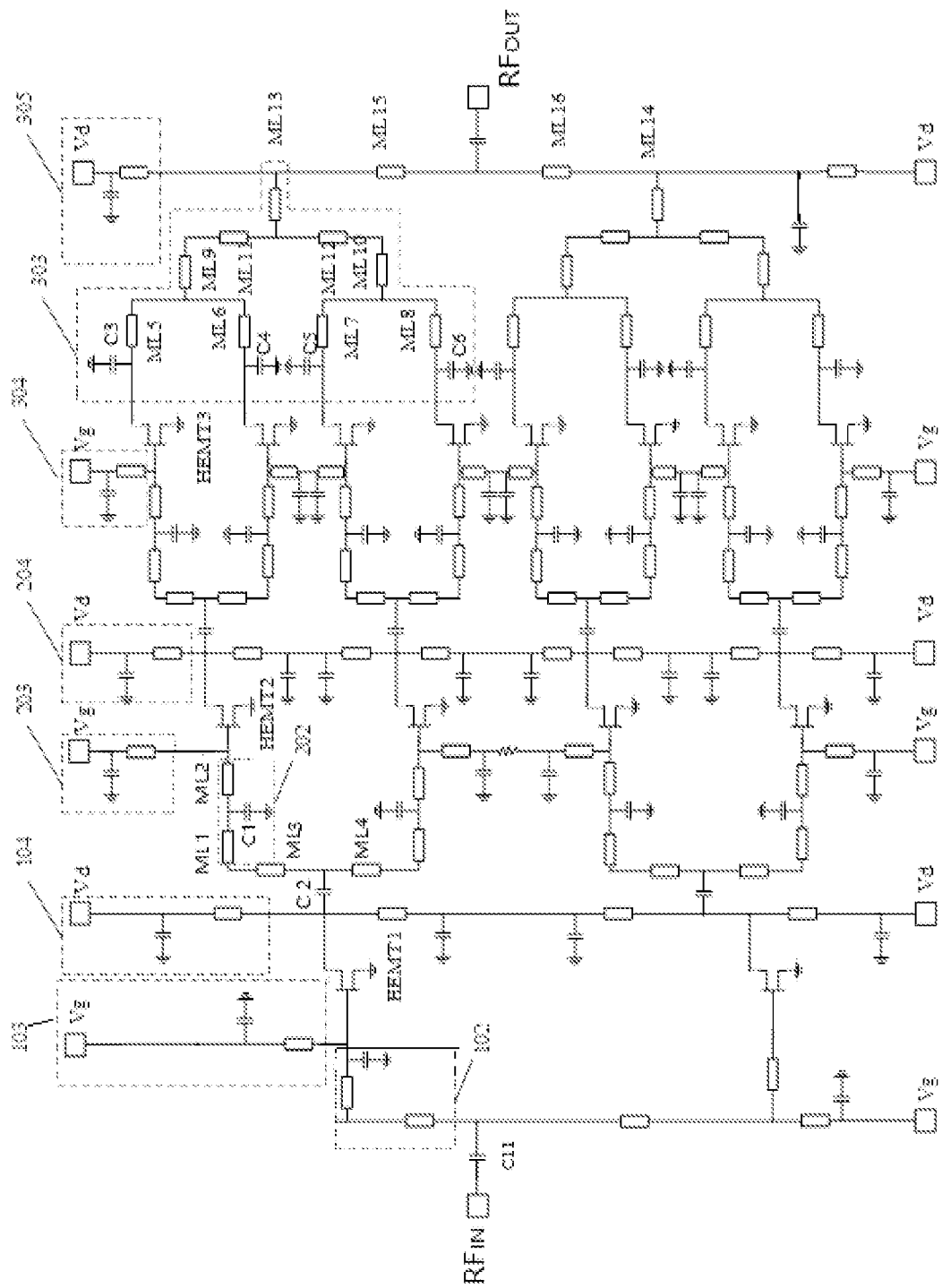
FIG. 4 is a circuit diagram of the Ka-band GaN MMIC power amplifier circuit provided by Embodiment 1 of the present disclosure.

As shown in FIG. 4, the present embodiment is described by taking three-stage cascade-connected amplification modules as examples, that is, the first amplification module 10, the second amplification module 20, and the third amplification module 30 are cascade-connected. The numbers of amplification units in the three stages of amplification modules are 2:4:8. That is, the first amplification module 10 includes two first amplification units 101, the second amplification module 20 includes four second amplification units 201, and the third amplification module 30 includes eight third amplification units 301. The input terminal of each amplification unit is correspondingly connected to a matching network unit, and the third amplification unit 301 of the third amplification module 30 is connected to a third reactance type matching unit 303.

The amplification unit of each of the amplification modules includes: a transistor. The transistor may be a high electron mobility transistor (HEMT).

The transistor includes a gate serving as the input terminal of the current amplification unit M1, a drain serving as the output terminal of the current amplification unit M1, and a source grounded.

As shown in FIG. 4, the specific circuit structure of the input network unit 102 may be that two microstrip lines are connected in series, one terminal serves as the input terminal of the input network unit 102, and the other terminal serves as the output terminal of the input network unit 102. The output terminal may be further connected to a ground capacitor, or may be other circuit structures, which are not limited in the present embodiment.

Optionally, the gate bias units have the same structure, the drain bias units have the same structure, and the gate bias unit and the drain bias unit may also have the same structure. As shown in FIG. 3, the circuit structures of the gate bias unit and the drain bias unit may also be other circuit structures, which are not limited in the present embodiment.

Optionally, as shown in FIG. 4, an inter-stage network unit may further be included between the front-stage amplification module and the current amplification module M to correspondingly connect one amplification unit in the front-stage amplification module to two current amplification units M1 through the matching network unit in the current amplification module M, so as to amplify the input RF signal. The specific circuit structure of the inter-stage network unit is not limited in the present embodiment, and may be composed of a capacitor C2, a microstrip line ML3, and a microstrip line ML4 as shown in FIG. 4, or other circuit structures may be used.

As shown in FIG. 4, the RF input terminal is connected to two input network units 102, and a filter capacitor C11 is connected between the RF input terminal and the input network unit 102. The two input network units 102 have completely the same structure, and only one of the input network units 102 is described in the present embodiment. The filter capacitor C11 includes one terminal connected to the RF input terminal and the other terminal connected to the input terminal of the input network unit 102. The output terminal of the input network unit 102 is connected to a gate of a transistor HEMT1 and the output terminal of the first gate bias unit 103.

The transistor HEMT1 includes a source grounded and a drain connected to an input terminal of the inter-stage network unit and the first drain bias unit 104 and connected to the second power supply through the first drain bias unit 104, and the second power supply may be a direct-current (DC) power supply.

There are two output terminals of the inter-stage network unit, which are connected to corresponding second matching network units 202, and the two second matching network units 202 are arranged in the second amplification module 20. As shown in FIG. 4, the other terminal of the microstrip line ML3 is connected to one terminal of the microstrip line ML1. The other terminal of the microstrip line ML1 is connected to one terminal of the microstrip line ML2 and one terminal of the capacitor C1. The other terminal of the microstrip line ML2 is connected to a gate of a transistor HEMT2 and the second gate bias unit 203. The other terminal of the capacitor C1 is grounded.

The other terminal of the microstrip line ML4 is connected to another transistor HEMT2 through another second matching network unit 202, which will not be described in detail, see FIG. 4 for details.

The transistor HEMT2 includes a source grounded and a drain connected to the output terminal of the second drain bias unit 204 and the inter-stage network unit of the third amplification module 30. Referring to FIG. 4, there are four second amplification units 201, each of which is connected to two third amplification units 301 through the inter-stage network unit and the matching network unit, and there are a total of eight third amplification units 301. The specific connection relationship of eight transistors HEMT3 is shown in FIG. 4.

Figure 5:
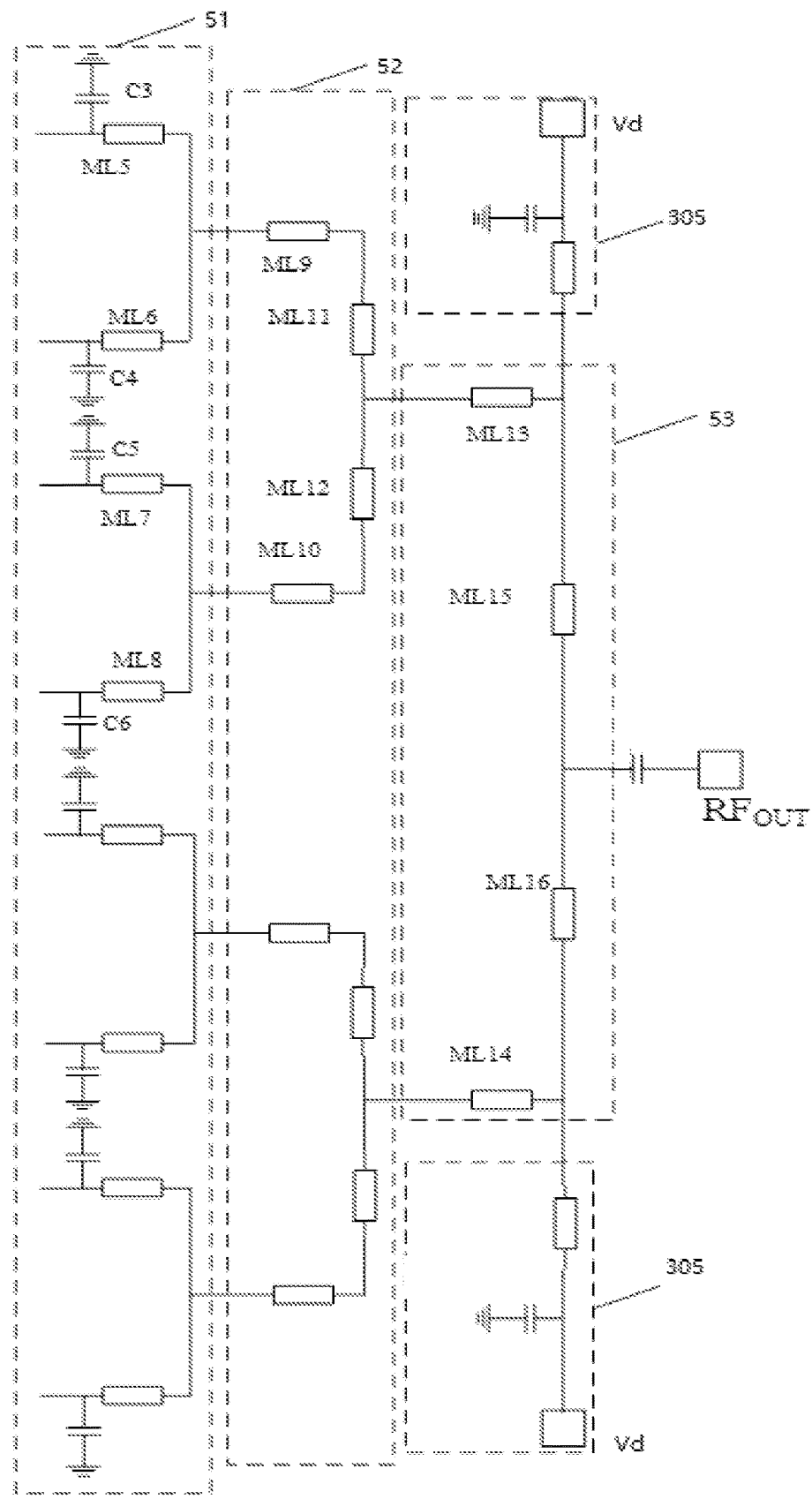
FIG. 5 is a schematic diagram of a circuit structure of a reactance type matching unit provided by Embodiment 1 of the present disclosure.

At least four transistors are included in the last amplification module N, and eight transistors are included in FIG. 4 and FIG. 5. The reactance type matching unit N3 is connected after the eight transistors. Due to the parallel inductor in the chip matching circuit in the prior art, a part of the signal will be connected to the ground, resulting in high loss. Therefore, in the present embodiment, the problem of high loss is solved by adopting the reactance type matching unit N3.

As shown in FIG. 4 and FIG. 5, the third reactance type matching unit 303 includes: a capacitor C3, a capacitor C4, a capacitor C5, a capacitor C6, a microstrip line ML5, a microstrip line ML6, a microstrip line ML7, a microstrip line ML8, a microstrip line ML9, a microstrip line ML10, a microstrip line ML11, a microstrip line ML12, and a microstrip line ML13.

The capacitor C3 includes one terminal connected to a drain of a first transistor in the last amplification module N and one terminal of the microstrip line ML5, and the other terminal grounded.

The capacitor C4 includes one terminal connected to a drain of a second transistor in the last amplification module N and one terminal of the microstrip line ML6, and the other terminal grounded.

The capacitor C5 includes one terminal connected to a drain of a third transistor in the last amplification module N and one terminal of the microstrip line ML7, and the other terminal grounded.

The capacitor C6 includes one terminal connected to a drain of a fourth transistor in the last amplification module N and one terminal of the microstrip line ML8, and the other terminal grounded.

The other terminal of the microstrip line ML5 is connected to the other terminal of the microstrip line ML6 and then connected to one terminal of the microstrip line ML9. The other terminal of the microstrip line ML7 is connected to the other terminal of the microstrip line ML8 and then connected to one terminal of the microstrip line ML10. The other terminal of the microstrip line ML9 is connected to one terminal of the microstrip line ML11. The other terminal of the microstrip line ML11 is connected to one terminal of the microstrip line ML12 and one terminal of the microstrip line ML13. The other terminal of the microstrip line ML12 is connected to the other terminal of the microstrip line ML10. The other terminal of the microstrip line ML13 serves as the output terminal of the reactance type matching unit N3.

In FIG. 4 and FIG. 5, eight transistors HEMT3 are connected to two third reactance type matching units 303. In FIG. 4 and FIG. 5, the microstrip line ML13 and the microstrip line ML14 are merged together again, that is, the other terminal of the microstrip line ML13 is connected in series with the microstrip line ML15 and the microstrip line ML16 and then connected to the other terminal of the microstrip line ML14. The RF output terminal is between the microstrip line ML15 and the microstrip line ML16. A filter capacitor is further connected between the RF output terminal and the microstrip line ML15 and the microstrip line ML16.

In FIG. 5, the third reactance type matching unit 303 is divided into three stages. The first stage 51 is led out by the drains of the eight HEMT3 in the third amplification unit 301 through the microstrip line. Each branch of the microstrip line is grounded by the capacitor, and then combined in pairs to lead out four output terminals. The second stage 52 leads the four output terminals of the first stage 51 to two output terminals through the combination of the microstrip lines again. The third stage 53 is connected to the RF output terminal after final synthesis, and is connected to the third drain bias circuit 305 in a direction perpendicular to the RF transmission direction. The third reactance type matching unit 303 does not contain a parallel inductor, which avoids the loss to ground caused by the parallel inductor, thereby improving efficiency. In addition, the reactance type matching unit N3 is of a cluster type. The impedance is first matched to the intermediate impedance, and then finally matched to the system impedance, which has the functions of power synthesis and impedance matching, and the third drain bias unit 305 is connected to the synthesis network, making the structure flexible and compact.

Optionally, when there are three cascade-connected amplification modules, an amplification unit in a second amplification module 20 and an amplification unit in a third amplification module 30 have a gate width ratio of 2.5, which promotes the best performance of the efficiency characteristics of the power amplifier circuit. It should be noted that the gate width ratio of the amplification unit in the second amplification module 20 and the amplification unit in the third amplification module 30 may also be other values.

It should be noted that the matching network unit and the reactance type matching unit N3 in the present embodiment can be used for MMICs of various materials, such as GaN and gallium arsenide (GaAs).

The above Ka-band GaN MMIC power amplifier is formed by adopting a plurality of cascade-connected amplification modules. The power amplifier circuit adopts a simple and compact matching network unit, and the microstrip line is adopted to replace an inductor. The whole chip does not contain an inductance element. A problem of a large area of a chip with an inductance device is solved. The area of the chip is greatly reduced while ensuring that other performance indexes are met, and power density is further improved. The high-efficiency reactance type matching unit N3 is used in the last amplification module N, and the matching topology does not contain a parallel inductor, which avoids the loss to ground caused by the parallel inductor, thereby improving the efficiency. In addition, the reactance type matching unit N3 is of a cluster type, integrates power synthesis and impedance matching, and connects the third drain bias unit 305 to the matching network, which has the advantages of flexibility and compactness. The Ka-band GaN MMIC power amplifier has a drive ratio of 2.5. Under this driving ratio, the output power of the second amplification module 20 drives the transistor HEMT3 in the third amplification unit 301 to a saturation state without being over-saturated, which promotes the best performance of the efficiency characteristics of the power amplifier circuit.

Embodiment 2

The present embodiment provides a power amplifier, including any of the Ka-band GaN MMIC power amplifier circuits in Embodiment 1, that is, the power amplifier is provided with any of the Ka-band GaN MMIC power amplifier circuits in Embodiment 1, and has beneficial effects brought by any of the Ka-band GaN MMIC power amplifier circuits in Embodiment 1. Other structures of the power amplifier are the same as those in the prior art, which will not be repeated here.

The foregoing embodiments are only used to explain the technical solutions of the present disclosure, and are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some technical features therein. These modifications or substitutions do not make the essence of the corresponding technical solutions deviate from the spirit and scope of the technical solutions in the embodiments of the present disclosure, and shall fall within the protection scope of the present disclosure.

What is claimed is:

1. A Ka-band gallium-nitride (GaN) monolithic-microwave integrated circuit (MMIC) power amplifier circuit, comprising: a plurality of cascade-connected amplification modules; wherein a first amplification module comprises a first amplification unit, and each of all of the amplification modules except the first amplification module comprises a matching network unit and an amplification unit;
   an input terminal of the first amplification unit, as an input terminal of the first amplification module, is configured to input a radio-frequency (RF) signal; and a current matching network unit comprises an input terminal connected to an output terminal of a front-stage amplification unit and an output terminal connected to an input terminal of a current amplification unit, an output terminal of the current amplification unit is connected to an input terminal of a matching network unit of a rear-stage amplification module, and an output terminal of a last amplification unit in a last amplification module, as an output terminal of the last amplification module, is configured to output the RF signal; and
   the matching network unit comprises: a microstrip line ML1, a microstrip line ML2, and a capacitor C1; and the microstrip line ML1 comprises one terminal connected to the output terminal of the front-stage amplification unit and the other terminal connected to one terminal of the microstrip line ML2 and one terminal of the capacitor C1, the other terminal of the microstrip line ML2 is connected to the input terminal of the current amplification unit, and the other terminal of the capacitor C1 is grounded.

2. The Ka-band GaN MMIC power amplifier circuit according to claim 1, wherein the last amplification module further comprises a reactance type matching unit; and
   the reactance type matching unit comprises an input terminal connected to the output terminal of the last amplification unit in the last amplification module and a first output terminal serving as the output terminal of the last amplification module.

3. The Ka-band GaN MMIC power amplifier circuit according to claim 2, wherein the first amplification module further comprises an input network unit; and
   the input network unit comprises a first input terminal serving as the input terminal of the first amplification module and an output terminal connected to the input terminal of the first amplification unit.

4. The Ka-band GaN MMIC power amplifier circuit according to claim 3, wherein each of the amplification modules further comprises a gate bias unit and a drain bias unit;
   the gate bias unit comprises an input terminal configured to connect a first power supply and an output terminal connected to the input terminal of the current amplification unit and the output terminal of the current matching network unit or the input network unit;
   the drain bias unit comprises an input terminal configured to connect a second power supply and an output terminal connected to the output terminal of the current amplification unit or a second output terminal of the reactance type matching unit of the last amplification module; and
   the first power supply is different from the second power supply.

5. The Ka-band GaN MMIC power amplifier circuit according to claim 1, wherein the amplification unit of each of the amplification modules comprises: a transistor; and
   the transistor comprises a gate serving as the input terminal of the current amplification unit, a drain serving as the output terminal of the current amplification unit, and a source grounded.

6. The Ka-band GaN MMIC power amplifier circuit according to claim 2, wherein the last amplification module comprises at least four transistors, and the reactance type matching unit comprises: a capacitor C3, a capacitor C4, a capacitor C5, a capacitor C6, a microstrip line ML5, a microstrip line ML6, a microstrip line ML7, a microstrip line ML8, a microstrip line ML9, a microstrip line ML10, a microstrip line ML11, a microstrip line ML12, and a microstrip line ML13;

the capacitor C3 comprises one terminal connected to a drain of a first transistor in the last amplification module and one terminal of the microstrip line ML5, and the other terminal grounded;

the capacitor C4 comprises one terminal connected to a drain of a second transistor in the last amplification module and one terminal of the microstrip line ML6, and the other terminal grounded;

the capacitor C5 comprises one terminal connected to a drain of a third transistor in the last amplification module and one terminal of the microstrip line ML7, and the other terminal grounded;

the capacitor C6 comprises one terminal connected to a drain of a fourth transistor in the last amplification module and one terminal of the microstrip line ML8, and the other terminal grounded; and the other terminal of the microstrip line ML5 is connected to the other terminal of the microstrip line ML6 and then connected to one terminal of the microstrip line ML9, the other terminal of the microstrip line ML7 is connected to the other terminal of the microstrip line ML8 and then connected to one terminal of the microstrip line ML10, the other terminal of the microstrip line ML9 is connected to one terminal of the microstrip line ML11, the other terminal of the microstrip line ML11 is connected to one terminal of the microstrip line ML12 and one terminal of the microstrip line ML13, the other terminal of the microstrip line ML12 is connected to the other terminal of the microstrip line ML10, and the other terminal of the microstrip line ML13 serves as the output terminal of the reactance type matching unit.

7. The Ka-band GaN MMIC power amplifier circuit according to claim 1, wherein when there are three cascade-connected amplification modules in cascade connection, an amplification unit in a second amplification module and an amplification unit in a third amplification module have a gate width ratio of 2.5.

8. The Ka-band GaN MMIC power amplifier circuit according to claim 2, wherein when there are three cascade-connected amplification modules in cascade connection, an amplification unit in a second amplification module and an amplification unit in a third amplification module have a gate width ratio of 2.5.

9. The Ka-band GaN MMIC power amplifier circuit according to claim 3, wherein when there are three cascade-connected amplification modules in cascade connection, an amplification unit in a second amplification module and an amplification unit in a third amplification module have a gate width ratio of 2.5.

10. The Ka-band GaN MMIC power amplifier circuit according to claim 4, wherein when there are three cascade-connected amplification modules in cascade connection, an amplification unit in a second amplification module and an amplification unit in a third amplification module have a gate width ratio of 2.5.

11. The Ka-band GaN MMIC power amplifier circuit according to claim 5, wherein when there are three cascade-connected amplification modules in cascade connection, an amplification unit in a second amplification module and an amplification unit in a third amplification module have a gate width ratio of 2.5.

12. The Ka-band GaN MMIC power amplifier circuit according to claim 6, wherein when there are three cascade-connected amplification modules in cascade connection, an amplification unit in a second amplification module and an amplification unit in a third amplification module have a gate width ratio of 2.5.

13. An amplifier, comprising the Ka-band GaN MMIC power amplifier circuit according to claim 1.

14. The amplifier according to claim 13, wherein the last amplification module further comprises a reactance type matching unit; and the reactance type matching unit comprises an input terminal connected to the output terminal of the last amplification unit in the last amplification module and a first output terminal serving as the output terminal of the last amplification module.

15. The amplifier according to claim 14, wherein the first amplification module further comprises an input network unit; and the input network unit comprises a first input terminal serving as the input terminal of the first amplification module and an output terminal connected to the input terminal of the first amplification unit.

16. The amplifier according to claim 15, wherein each of the amplification modules further comprises a gate bias unit and a drain bias unit;

the gate bias unit comprises an input terminal configured to connect a first power supply and an output terminal connected to the input terminal of the current amplification unit and the output terminal of the current matching network unit or the input network unit;

the drain bias unit comprises an input terminal configured to connect a second power supply and an output terminal connected to the output terminal of the current amplification unit or a second output terminal of the reactance type matching unit of the last amplification module; and the first power supply is different from the second power supply.

17. The amplifier according to claim 13, wherein the amplification unit of each of the amplification modules comprises: a transistor; and the transistor comprises a gate serving as the input terminal of the current amplification unit, a drain serving as the output terminal of the current amplification unit, and a source grounded.

18. The amplifier according to claim 14, wherein the last amplification module comprises at least four transistors, and the reactance type matching unit comprises: a capacitor C3, a capacitor C4, a capacitor C5, a capacitor C6, a microstrip line ML5, a microstrip line ML6, a microstrip line ML7, a microstrip line ML8, a microstrip line ML9, a microstrip line ML10, a microstrip line ML11, a microstrip line ML12, and a microstrip line ML13;

the capacitor C3 comprises one terminal connected to a drain of a first transistor in the last amplification module and one terminal of the microstrip line ML5, and the other terminal grounded;

the capacitor C4 comprises one terminal connected to a drain of a second transistor in the last amplification module and one terminal of the microstrip line ML6, and the other terminal grounded;

the capacitor C5 comprises one terminal connected to a drain of a third transistor in the last amplification module and one terminal of the microstrip line ML7, and the other terminal grounded;

the capacitor C6 comprises one terminal connected to a drain of a fourth transistor in the last amplification module and one terminal of the microstrip line ML8, and the other terminal grounded; and the other terminal of the microstrip line ML5 is connected to the other terminal of the microstrip line ML6 and then connected to one terminal of the microstrip line ML9, the other terminal of the microstrip line ML7 is connected to the other terminal of the microstrip line ML8 and then connected to one terminal of the microstrip line ML10, the other terminal of the microstrip line ML9 is connected to one terminal of the microstrip line ML11, the other terminal of the microstrip line ML11 is connected to one terminal of the microstrip line ML12 and one terminal of the microstrip line ML13, the other terminal of the microstrip line ML12 is connected to the other terminal of the microstrip line ML10, and the other terminal of the microstrip line ML13 serves as the output terminal of the reactance type matching unit.

19. The amplifier according to claim 13, wherein when there are three cascade-connected amplification modules in cascade connection, an amplification unit in a second amplification module and an amplification unit in a third amplification module have a gate width ratio of 2.5.

* * * * *